United States Patent
Choi et al.

(10) Patent No.: US 8,431,945 B2
(45) Date of Patent: Apr. 30, 2013

(54) LIGHT EMITTING DEVICE, LIGHT EMITTING DEVICE PACKAGE, AND LIGHTING SYSTEM

(75) Inventors: Hyun Min Choi, Seoul (KR); Sun Kyung Kim, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 67 days.

(21) Appl. No.: 13/092,275

(22) Filed: Apr. 22, 2011

(65) Prior Publication Data

US 2011/0260188 A1 Oct. 27, 2011

(30) Foreign Application Priority Data

Apr. 23, 2010 (KR) .................. 10-2010-0037874

(51) Int. Cl.
*H01L 33/00* (2010.01)
*H01L 21/00* (2006.01)

(52) U.S. Cl.
USPC .............. 257/98; 257/E33.068; 257/E33.069; 438/29

(58) Field of Classification Search .................... 257/98, 257/E33.068–E33.069; 438/29
See application file for complete search history.

(56) References Cited

U.S. PATENT DOCUMENTS

| | | | | |
|---|---|---|---|---|
| 6,594,297 | B1 * | 7/2003 | Hayakawa | 372/46.01 |
| 6,643,304 | B1 * | 11/2003 | Chen et al. | 372/50.11 |
| 2003/0077847 | A1 | 4/2003 | Yoo | 438/22 |
| 2006/0292804 | A1 | 12/2006 | Seo et al. | 438/287 |
| 2007/0019697 | A1 * | 1/2007 | Miller et al. | 372/50.11 |
| 2007/0036189 | A1 * | 2/2007 | Hori et al. | 372/50.11 |
| 2007/0145883 | A1 * | 6/2007 | Ohashi et al. | 313/498 |
| 2007/0284567 | A1 * | 12/2007 | Pokrovskiy et al. | 257/13 |
| 2008/0002750 | A1 * | 1/2008 | Onishi et al. | 372/50.11 |
| 2008/0179605 | A1 * | 7/2008 | Takase et al. | 257/94 |
| 2008/0303047 | A1 * | 12/2008 | Shen et al. | 257/98 |
| 2009/0108250 | A1 * | 4/2009 | Kim et al. | 257/13 |

(Continued)

FOREIGN PATENT DOCUMENTS

| | | |
|---|---|---|
| JP | 10-270754 A | 10/1998 |
| JP | 2005-019750 A | 1/2005 |

(Continued)

OTHER PUBLICATIONS

Korean Office Action dated Jan. 7, 2011 issued in Application No. 10-2010-0037874.

(Continued)

*Primary Examiner* — Matthew W Such
*Assistant Examiner* — Jeremy Joy
(74) *Attorney, Agent, or Firm* — KED & Associates, LLP

(57) ABSTRACT

Disclosed are a light emitting device, a light emitting device package, and a lighting system. The light emitting device includes a light emitting structure including a first conductive semiconductor layer, an active layer, and a second conductive semiconductor layer on, a light transmissive substrate having a refractive index lower than a refractive index of a compound semiconductor layer, and a mirror structure layer having a structure in which a first mirror layer having a first refractive index and a second mirror layer having a second refractive index different from the first refractive index are alternately stacked on each other. The first mirror layer has a thickness of $W \cdot \lambda/(4 \cdot n1 \cdot m)$, and the second mirror layer has a thickness of $W \cdot \lambda/(4 \cdot n2 \cdot m)$ in which the W represents a weight constant in a range of about 1.05 to about 1.25.

20 Claims, 8 Drawing Sheets

U.S. PATENT DOCUMENTS

| | | | |
|---|---|---|---|
| 2010/0084679 A1* | 4/2010 | Hsieh et al. | 257/98 |
| 2010/0252850 A1 | 10/2010 | Park et al. | 257/98 |
| 2011/0108798 A1* | 5/2011 | Song | 257/13 |
| 2011/0188807 A1* | 8/2011 | Fattal et al. | 385/37 |
| 2011/0266573 A1* | 11/2011 | Kim et al. | 257/98 |
| 2012/0012856 A1* | 1/2012 | Chen et al. | 257/76 |
| 2012/0199179 A1* | 8/2012 | Nakata | 136/250 |

FOREIGN PATENT DOCUMENTS

| | | |
|---|---|---|
| KR | 10-2005-0020502 A | 3/2005 |
| KR | 10-0576856 B1 | 5/2006 |
| KR | 10-0667506 B1 | 1/2007 |
| KR | 10-2007-0117336 A | 12/2007 |
| KR | 10-2008-0017180 A | 2/2008 |
| KR | 10-2009-0025507 A | 3/2009 |
| WO | WO 2009154383 A2 * | 12/2009 |

OTHER PUBLICATIONS

Korean Notice of Allowance dated Jun. 7, 2011 issued in Application No. 10-2010-0037874.

* cited by examiner

LIGHT EMITTING DEVICE, LIGHT EMITTING DEVICE PACKAGE, AND LIGHTING SYSTEM

The present application claims priority under 35 U.S.C. §119(a) of Korean Patent Application No. 10-2010-0037874 filed on Apr. 23, 2010, which is hereby incorporated by reference in its entirety.

BACKGROUND

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device having a novel structure.

The embodiment provides a light emitting device capable of improving light extraction efficiency.

The embodiment provides a light emitting device including a reflective layer formed by stacking layers having different refractive indexes disposed a lower portion thereof.

The embodiment provides a light emitting device package having a light emitting device and a lighting system, capable of improving reliability.

According to the embodiment, a light emitting device includes a light emitting structure including a first conductive semiconductor layer, an active layer on the first conductive semiconductor layer, and a second conductive semiconductor layer on the active layer, a light transmissive substrate disposed under the light emitting structure and having a refractive index lower than a refractive index of a compound semiconductor layer, and a mirror structure layer disposed under the light transmissive substrate and including a first mirror layer having a first refractive index and a second mirror layer having a second refractive index different from the first refractive index, wherein the first mirror layer and second mirror layer are alternately stacked on each other. The first mirror layer has a thickness of $W\cdot\lambda/(4\cdot n1\cdot m)$, and the second mirror layer has a thickness of $W\cdot\lambda/(4\cdot n2\cdot m)$ in which $\lambda$ represents a wavelength of a light emitted from the light emitting structure, n1 and n2 represent the first and second refractive indexes, respectively, m represents a natural number, and W represents a weight constant in a range of about 1.05 to about 1.25.

According to the embodiment, a light emitting device includes a light emitting structure including a first conductive semiconductor layer, an active layer on the first conductive semiconductor layer, and a second conductive semiconductor layer on the active layer, a substrate disposed under the light emitting structure and having a refractive index lower than a refractive index of a compound semiconductor layer, and a mirror structure layer disposed under the substrate and including a plurality of first mirror layers having a first refractive index higher than a refractive index of the substrate, and a plurality of second mirror layers disposed between the first mirror layers and having a second refractive index lower than the first refractive index. The first mirror layer has a thickness of $W\cdot\lambda/(4\cdot n1\cdot m)$, and the second mirror layer has a thickness of $W\cdot\lambda/(4\cdot n2\cdot m)$ in which $\lambda$ represents a wavelength of a light emitted from the light emitting structure, n1 and n2 represent the first and second refractive indexes, respectively, m represents a natural number, and W represents a weight constant in a range of about 1.05 to about 1.25.

According to the embodiment, a light emitting device package includes a body a plurality of lead electrodes on the body, a light emitting device electrically connected to the lead electrodes, and a molding member covering the light emitting device.

The light emitting device includes a light emitting structure including a first conductive semiconductor layer, an active layer on the first conductive semiconductor layer, and a second conductive semiconductor layer on the active layer, a light transmissive substrate disposed under the light emitting structure and having a refractive index lower than a refractive index of a compound semiconductor layer, and a mirror structure layer disposed under the light transmissive substrate and including a first mirror layer having a first refractive index and a second mirror layer having a second refractive index different from the first refractive index, wherein the first mirror layer and the second mirror layer are alternately stacked on each other. The first mirror layer has a thickness of $W\cdot\lambda/(4\cdot n1\cdot m)$, and the second mirror layer has a thickness of $W\cdot\lambda/(4\cdot n2\cdot m)$ in which $\lambda$ represents a wavelength of a light emitted from the light emitting structure, n1 and n2 represent the first and second refractive indexes, respectively, m represents a natural number, and W represents a weight constant in a range of about 1.05 to about 1.25.

DETAILED DESCRIPTION OF THE EMBODIMENTS

Figure 1:
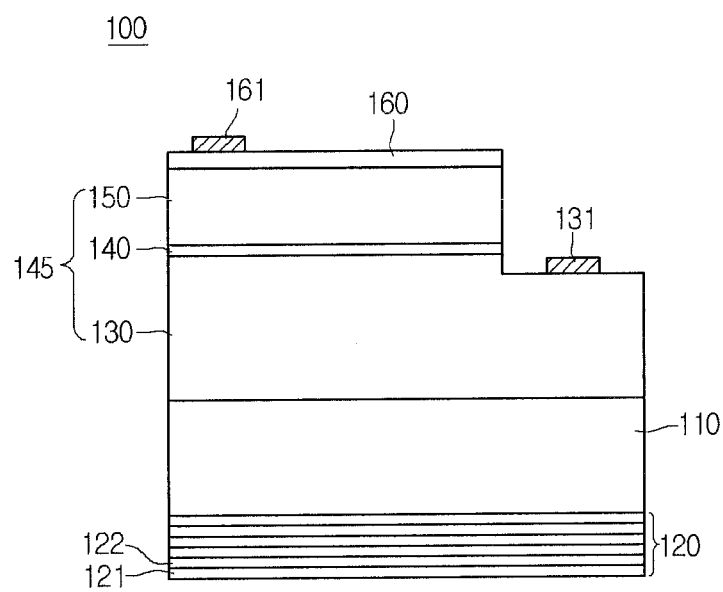
FIG. 1 is a sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
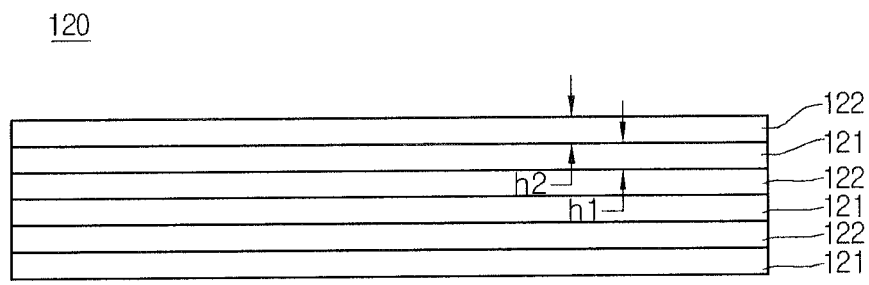
FIG. 2 is a view showing a mirror structure layer of the light emitting device of FIG. 1.

FIG. 1 is a sectional view showing a light emitting device 100 according to the embodiment, and FIG. 2 is a view showing a mirror structure layer of the light emitting device 100 of FIG. 1.

Referring to FIGS. 1 and 2, the light emitting device 100 includes a substrate 110, a mirror structure layer 120, a light emitting structure 145, a current spreading layer 160, a first electrode 131, and a second electrode 161.

The substrate 110 may include a light transmissive material selected from the group consisting of sapphire ($Al_2O_3$), GaN, ZnO, and AlN. The substrate 110 includes a material having a refractive index lower than a refractive index (2.4) of a nitride semiconductor. For example, the refractive index of the sapphire is in the range of about 1.75 to about 1.76, and the refractive index of ZnO is about 2.0.

The mirror structure layer 120 is disposed under the substrate 110. The mirror structure layer 120 is stacked under a lower surface of the substrate 110 to reflect a light incident through the substrate 110.

As shown in FIG. 2, the mirror structure layer 120 includes a first mirror layer 121 having a first refractive index n1, and a second mirror layer 122 having a second refractive index n2 different from the first refractive index n 1. A pair of the first and second mirror layers 121 and 122 are repeatedly stacked.

A Plurality of compound semiconductor layers are disposed on the substrate 110. The compound semiconductor layers include group III-V compound semiconductors having a compositional formula of $In_xAl_yGa_{1-x-y}N$ ($0 \leq x \leq 1$, $0 \leq y \leq 1$, $0 \leq x+y \leq 1$).

An undoped semiconductor layer is disposed on the substrate 110. The undoped semiconductor layer is not doped with conductive dopants, and has electrical conductivity significantly lower than that of first and second conductive semiconductor layers 130 and 150. For example, the undoped semiconductor layer may include a semiconductor material selected from the group consisting of InAlGaN, GaN, AlGaN, InGaN, AlN, InN, and AlInN having a compositional formula of $In_xAl_yGa_{1-x-y}N$ ($0 \leq x \leq 1$, $0 \leq y \leq 1$, and $0 \leq x+y \leq 1$), but the embodiment is not limited thereto.

A buffer layer (not shown) may be disposed between the undoped semiconductor layer and the substrate 110 in order to reduce the lattice constant difference between the undoped semiconductor layer and the substrate 110. The lattice constant of the buffer layer may have an value between the lattice constant of the substrate 110 and the lattice constant of the undoped semiconductor layer. The buffer layer (not shown) may include a semiconductor material having a compositional formula of $In_xAl_yGa_{1-x-y}N$ ($0 \leq x \leq 1$, $0 \leq y \leq 1$, and $0 \leq x+y \leq 1$). For example, the buffer layer may include a material selected from the group consisting of InAlGaN, GaN, AlGaN, InGaN, AlN, InN, and AlInN, but the embodiment is not limited thereto. In addition, the buffer layer may include a compound semiconductor including a group II to VI element, but the embodiment is not limited thereto.

Any one of the buffer layer and the undoped semiconductor layer may be not formed, or at least one of the buffer layer and the undoped semiconductor layer may be formed, but the embodiment is not limited thereto.

The light emitting structure 145 has a structure in which the first conductive semiconductor layer 130, the active layer 140, and the second conductive semiconductor layer 150 are sequentially stacked. The first electrode 131 and the second electrode 161 may be disposed on the first and second conductive semiconductor layers 130 and 150, respectively. The light emitting structure 145 provides power from the first and second electrodes 131 and 161 to generate a light. The light emitting structure 145 may emit a light of visible ray band having blue, green, or red or a light of a (ultraviolet) ray band that emits UV light.

The first conductive semiconductor layer 130 may be disposed on one of the substrate 110, the buffer layer, and the undoped semiconductor layer. The first conductive semiconductor layer 130 includes a group III-V compound semiconductor layer including first conductive dopants. For example, the first conductive semiconductor layer 130 may include an N type semiconductor layer, and the N type semiconductor layer may include semiconductor materials having the compositional formula of $In_xAl_yGa_{1-x-y}N$ ($0 \leq x \leq 1$, $0 \leq y \leq 1$, and $0 \leq x+y \leq 1$). For example, the first conductive semiconductor layer 130 may include a semiconductor material selected from the group consisting of InAlGaN, GaN, AlGaN, InGaN, AlN, InN, and AlInN. The N type semiconductor layer may be doped with an N type dopant such as Si, Ge, Sn, Se or Te.

The first conductive semiconductor layer 130 may include at least two layers having different thicknesses or different dopant concentrations, but the embodiment is not limited thereto.

The active layer 140 is formed on the first conductive semiconductor layer 130. The active layer 140 emits the light having energy determined based on energy band difference according to materials constituting the active layer 140 through the recombination of electrons (or holes) injected through the first conductive semiconductor layer 130 and holes (or electrons) injected through the second conductive semiconductor layer 150.

The active layer 140 may have at least one of a SQW (single quantum well) structure, an MQW (multi-quantum well) structure, a quantum dot structure, and a quantum-wire structure. The active layer 140 may have the structure in which a plurality of quantum well layers and a plurality of quantum barrier layers are alternately stacked. The quantum well layer has an energy band gap different from that of the quantum barrier layer. For example, the active layer 140 may include a semiconductor material having a compositional formula of $In_xAl_yGa_{1-x-y}N$ ($0 \leq x \leq 1$, $0 \leq y \leq 1$, and $0 \leq x+y \leq 1$).

A first clad layer (not shown) doped with N type dopants may be formed under the active layer 140 and a second clad layer doped with P type dopants may be formed on the active layer 140. The first and second clad layers (not shown) may include a semiconductor having an energy band gap higher than that of the quantum barrier layer and/or the quantum well layer of the active layer 140. For example, the first and second clad layers (not shown) may include an AlGaN layer or an InAlGaN layer.

The second conductive semiconductor layer 150 may be formed on the active layer 140. The second conductive semiconductor layer 150 may include a group III-V compound semiconductor layer doped with second conductive dopants. For example, the second conductive semiconductor layer 150 may include a P type semiconductor layer. The P type semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$). For example, the P type semiconductor layer may include a semiconductor material selected from the group consisting of InAlGaN, GaN, AlGaN, InGaN, AlN, InN, and AlInN, and may be doped with a P type dopant such as Mg, Zn, Ca, Sr, or Ba.

Meanwhile, the first conductive semiconductor layer 130 may include a P type semiconductor layer, and the first conductive semiconductor layer 150 may include an N type semiconductor layer, but the embodiment is not limited thereto. In addition, a third conductive semiconductor layer (not shown) doped with N type dopants or P type dopants may be formed on the second conductive semiconductor layer 150. Accordingly, the light emitting device may have one of an N—P junction structure, a P—N junction structure, an N-P-N junction structure, and a P-N-P junction structure. In this case, the symbols "N" and "P" represent N and P type semiconductor layers, respectively, and the symbol "–" represents that two layers are directly or indirectly stacked on each other.

A light generated from the active layer 140 may be emitted to the outside through the top surface and the lateral surface of the light emitting device 100. Although not shown, a concavo-convex structure or a roughness structure may be formed on the top surface and/or the lateral surface of the light emitting device 100 in order to improve the light extraction efficiency.

A current spreading layer 160 may be further formed between the second electrode 161 and the second conductive semiconductor layer 150 to improve the current spreading property. The current spreading layer 160 is formed of a transparent layer. For example, the current spreading layer 160 may include at least one of ITO, IZO(In—ZnO), GZO (Ga—ZnO), AZO(Al—ZnO), AGZO(Al—Ga ZnO), IGZO (In—Ga ZnO), IrOx, RuOx, RuOx/ITO, Ni/IrOx/Au, and Ni/IrOx/Au/ITO.

Meanwhile, the mirror structure layer 120 reflects a light incident downward from the light emitting structure 145, that is, the light incident toward the substrate 110 so that the light may be emitted through the top surface or the lateral surface of the light emitting device 100.

The mirror structure layer 120 reflects a light incident downward from the light emitting structure 145 with high efficiency, and may include multiple thin film mirrors.

The mirror structure layer 120 may include a structure in which a first mirror layer 121 having a first refractive index n1 and a second mirror layer 122 having a second refractive index n2 different from the first refractive index n1 are repeatedly stacked one time or more The first and second mirror layers 121 and 122 may have different thicknesses and different refractive indexes.

The thickness of each of the first and second mirror layers 121 and 122 may be obtained as multiply a weight constant (W) by a value obtained by dividing the wavelength (λ) of the light emitted from the light emitting structure 145 by 4 nm (n: refractive index, and m: natural number).

In this case, the weight constant (W) may be in the range of about 1.05 to about 1.25, preferably, in the range of about 1.1 to about 1.2. In this case, the wavelength (λ) of the light represents a dominant wavelength. In the case of a blue light, the wavelength (λ) may be in the range of about 440 nm to about 490 nm. In the case of a green light, the wavelength (λ) may be in the range of about 500 nm to about 565 nm. In the case of a red light, the wavelength (λ) may be in the range of about 625 nm to about 740 nm.

Therefore, the thickness h1 of the first mirror layer 121 may be represented as $W \cdot \lambda/(4 \cdot n1 \cdot m)$, and the thickness h2 may be represented as $W \cdot \lambda/(4 \cdot n2 \cdot m)$.

The thickness of each mirror layer=$W \cdot \lambda(4nm)$ ($W$: weight constant, $n$: refractive index, and $m$: natural number)  Equation 1

Meanwhile, the first mirror layer 121 may include one selected from the group consisting of $SiO_2$, $TiO_2$, MgF, and $SiN_x$, and the second mirror layer 122 may include one selected from the group consisting of $SiO_2$, $TiO_2$, MgF, and $SiN_x$, but the embodiment is not limited thereto. The above materials may be easily deposited through depositions schemes. In the case, the $TiO_2$ has a refractive index in the range of about 2.3 to about 2.6, and the $SiO_2$ has the refractive index in the range of about 1.53 to about 1.54. The MgF includes $MgF_2$, and has a refractive index of about 1.38. The refractive index of the SiOx has the refractive index of about 1.5. In this case, the pair structure of the first and second mirror layers 121 and 122 includes at least one of a $TiO_2/SiO_2$ stack structure, a $TiO_2$/MgF stack structure, and a $TiO_2$/SiOx stack structure.

When the refractive index of the first mirror layer 121 is 2.4, the refractive index of the second mirror layer 122 is 1.4, and the peak wavelength or the dominant wavelength of the light is 450 nm, if the weight constant of 1.1 is applied to Equation 1, the thickness difference between the first and second mirror layers 121 and 122 becomes about 58.72 nm. If the weight constant is increased to 1.2, the thickness difference between the first and second mirror layers 121 and 122 may be increased to the thickness which is at least 8 nm greater than the 58.72 nm. Preferably, the thickness difference between the first and second mirror layers 121 and 122 may be in the range of about 50 nm to about 70 nm.

A plurality of first mirror layers 121 have a first refractive index. A plurality of second mirror layers 122 are interposed between the first mirror layers 121 and have a second refractive index different from the first refractive index. The first mirror layer 121 or the second mirror layer 122 may make contact with the lower surface of the substrate 110. Preferably, a mirror layer having a refractive index between the refractive index of the substrate 110 and the first refractive index, for example, a low refractive index may be disposed under the substrate 110. The difference between the first and second refractive indexes may be 0.5 or more, preferably, 1 or more.

If the second mirror layer 122 has a low refractive index, the first mirror layer 121 may have a high refractive index. The second mirror layer 122 having a low refractive index may be disposed under the substrate 110, and the first mirror layer 121 may have a refractive index higher than the refractive index of the substrate 110 and the refractive index of the second mirror layer 122.

In addition, if the difference in the refractive index between the first and second mirror layers 121 and 122 is 1 or more, the first and second mirror layers 121 and 122 may be repeatedly stacked at least four times. Accordingly, the quantity of light reflected by the mirror structure layer 120 among lights incident at various incidence angles from the light emitting structure 145 may be increased.

Figure 3:
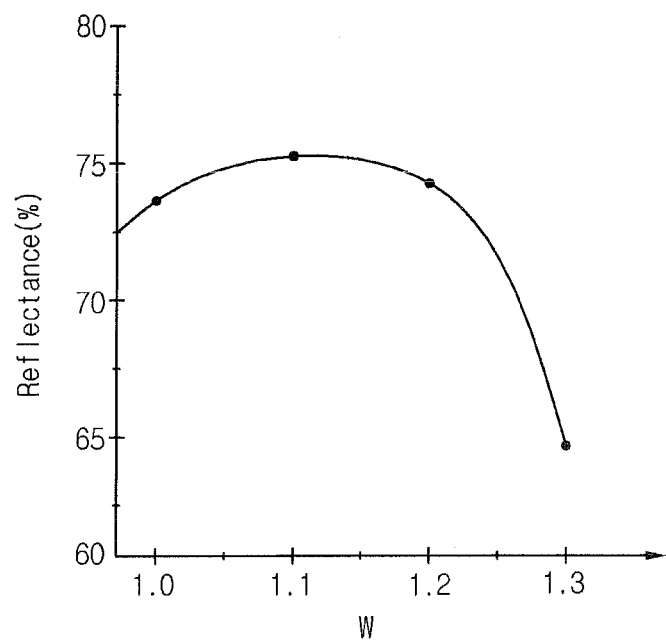
FIG. 3 is a graph showing the experimental result representing the reflectance according to thicknesses of the mirror structure layer in the light emitting device of FIG. 1.

FIG. 3 is a graph showing the experimental result for the reflectance according to the thicknesses of the first and second mirror layers 121 and the second mirror layer 122 of the mirror structure layer 120.

Referring to FIG. 3, the thickness h1 of the first mirror layer 121 is represented as $W \cdot \lambda/(4 \cdot n1 \cdot m)$, and the thickness h2 of the second mirror layer 122 is represented as $W \cdot \lambda/(4 \cdot n2 \cdot m)$. If the weight constant (W) is in the range of about 1.1 to about 1.2, the light emitting device 100 represents the greatest reflectance (unit:%).

In other words, in the structure in which two mirror layers are repeatedly stacked to represent a reflection effect, when each mirror layer has a thickness corresponding to multiply the weight constant (W) by λ/(4 nm), higher reflectance can be represented as compared with the case in which each mirror layer has the thickness of $\lambda/(4$ nm) (n: refractive index, and m: natural number).

The reasons for the experimental results are as follows.

The first reason is why the light emitted from the light emitting structure 145 does not have a short wavelength, but has a specific wavelength band. In other words, the light emitted from the light emitting structure 145 may be a set of lights having various wavelengths. Accordingly, when the first and second mirror layers 121 and 122 have the thickness corresponding to multiply the weight constant (W) by $\lambda/(4$ nm), the reflection effect can be more remarkably represented.

The second reason is why the light emitted from the light emitting structure 145 has various incidence angles. In other words, since the light incidence angle of a light incident into the mirror structure layer 120 from the light emitting structure 145 is in the range of about −90° to 90° as well as a vertical angle 0° with respect to the light emitting structure 145, the light paths vary according to the light incidence angles even if the layers have the same thickness.

For example, in the light emitting structure 145, the traveling path of the light vertically incident into the mirror structure layer 120 may be shorter than the traveling path of the light incident into the mirror structure layer 120 at an angle of 45°.

Therefore, when considering the incidence angle of a light emitted from the light emitting device 100 according to the embodiment, the reflection efficiency of the light emitting device 100 can be more highly represented when the weight constant (W) is multiplied by $\lambda/4$ nm as shown in the experimental result.

As described above, the mirror structure layer 120 having the thickness according to the embodiment is formed, so that the light emitting device having high light emission efficiency can be provided.

According to the embodiment, the second mirror layers 122 having the second refractive index are interposed between the first mirror layers 121, so that the light reflection efficiency can be improved. The first mirror layer 121 or the second mirror layer 122 may make contact with the lower surface of the substrate 110. Preferably, a mirror layer having a refractive index adjacent to that of the substrate 110 may be disposed under the substrate 110. The difference between the first and second refractive indexes may be 0.5 or more, preferably, 1 or more.

Hereinafter, a method for manufacturing the light emitting device 100 according to the embodiment will be described in detail.

Figure 4:
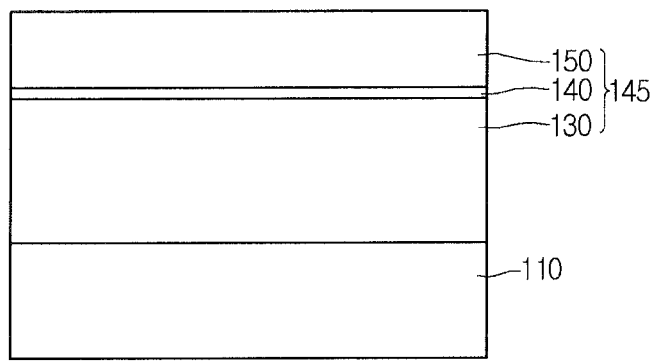
FIGS. 4 to 6 are sectional views showing a method for manufacturing the light emitting device according to the first embodiment.
Figure 5:
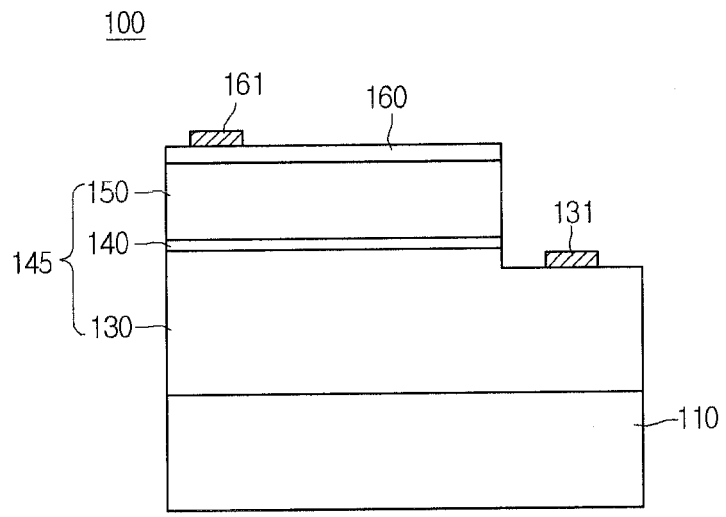
Figure 6:
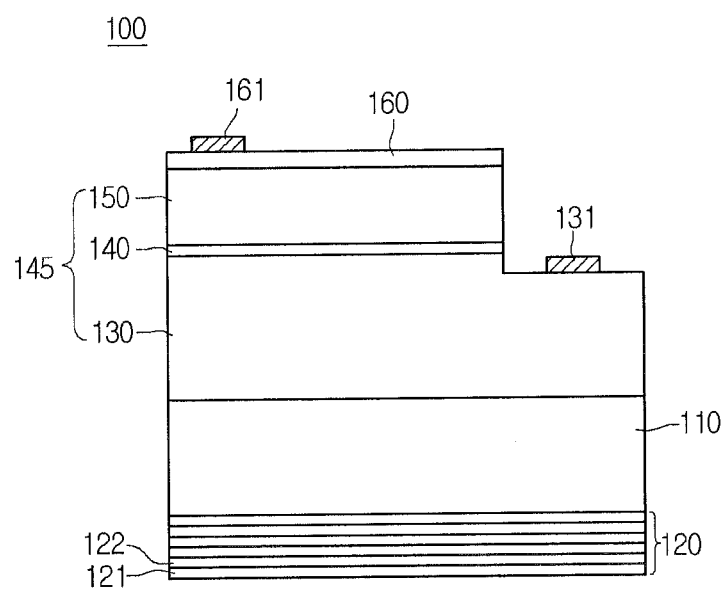

FIGS. 4 to 6 are sectional views showing the method for manufacturing the light emitting device according to the embodiment.

Referring to FIG. 4, the light emitting structure 145 including a plurality of compound semiconductor layers may be formed on the substrate 110.

The substrate 110 may include a light transmissive material selected from the group consisting of $Al_2O_3$, GaN, ZnO, and AlN.

The compound semiconductors may be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy) or HVPE (Hydride Vapor Phase Epitaxy), but the embodiment is not limited thereto.

For example, the light emitting structure 145 may include a plurality of compound semiconductor layers having a compositional formula of $In_xAl_yGa_{1-x-y}N$ ($0 \leq x \leq 1$, $0 \leq y \leq 1$, and $0 \leq x+y \leq 1$). For example, the light emitting structure 145 may include the first conductive semiconductor layer 130 doped with first conductive dopants, the active layer 140 on the first conductive semiconductor layer 130, and the second conductive semiconductor layer 150 doped with the second conductive dopants on the active layer 140.

An undoped semiconductor layer and/or a buffer layer may be disposed between the first conductive semiconductor layer 130 and the substrate 110, but the embodiment is not limited thereto.

For example, the first conductive semiconductor layer 130 may include an N type semiconductor layer, and the N type semiconductor layer may include semiconductor materials having the compositional formula of $In_xAl_yGa_{1-x-y}N$ ($0 \leq x \leq 1$, $0 \leq y \leq 1$, and $0 \leq x+y \leq 1$). For example, the first conductive semiconductor layer 130 may include a semiconductor material selected from the group consisting of GaN, MN, AlGAN, InGaN, InN, InAlGan, and AlIn. The N type semiconductor layer may be doped with an N type dopant such as Si, Ge, or Sn.

The undoped semiconductor layer is formed in order to improve the crystal characteristic. The undoped semiconductor layer has the same characteristics as those of the first conductive semiconductor layer 130 except that the undoped semiconductor layer has electric conductivity remarkably lower than that of the first conductive semiconductor layer 130.

For example, the active layer 140 may include a semiconductor material having a compositional formula of $In_xAl_yGa_{1-x-y}N$ ($0 \leq x \leq 1$, $0 \leq y \leq 1$, and $0 \leq x+y \leq 1$). The active layer 140 may have a SQW structure or an MQW structure. In addition, the active layer 140 may have a quantum dot structure or a quantum wire structure.

The active layer 140 may generate a light by energy obtained the recombination of electrons and holes supplied from the first and second conductive semiconductor layers 130 and 150.

For example, the second conductive semiconductor layer 150 may include a P type semiconductor layer. The P type semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$). For example, the P type semiconductor layer may include a semiconductor material selected from the group consisting of GaN, AlN, AlGaN, InGaN, InN, InAlGaN, and AlInN, and may be doped with a P type dopant such as Mg, Zn, Ca, Sr, or Ba.

Referring to FIG. 5, the first electrode 131 may be formed on the first conductive semiconductor layer 130, and the second electrode 161 may be formed on the second conductive semiconductor layer 150.

In this case, in order to form the first electrode 131, a mesa-etching process may be performed with respect to the light emitting structure 145 so that the first conductive semiconductor layer 130 is exposed.

The first and second electrodes 131 and 161 may include at least one selected from the group consisting of aluminum (Al), titanium (Ti), chromium (Cr), nickel (Ni), copper (Cu), and gold (Au).

Meanwhile, a current spreading layer 160 may be additionally interposed between the second electrode 161 and the second conductive semiconductor layer 150 in order to improve a current spreading property.

For example, the current spreading layer 160 may be formed of a transparent material including at least one of ITO, IZO(In—ZnO), GZO(Ga—ZnO), AZO(Al—ZnO), AGZO (Al—Ga ZnO), IGZO(In—Ga ZnO), IrOx, RuOx, $R^{uo}$x/ITO, Ni/IrOx/Au, and Ni/IrOx/Au/ITO.

Referring to FIG. 6, the light emitting device 100 according to the embodiment can be provided by forming the mirror structure layer 120 under the substrate 110. The mirror structure layer 120 may be formed through various schemes according to the materials constituting the mirror structure layer 120.

In the mirror structure layer 120, the second mirror layer 122 is formed on the lower surface of the substrate 110, and the first mirror layer 121 is formed under the second mirror layer 122. A pair of the first and second mirror layers 121 and 122 are stacked at least four times. In this case, the first mirror layer 121 may be formed on the lower surface of the substrate 110, but the embodiment is not limited thereto.

If the mirror structure layer 120 includes a material selected from the group consisting of $SiO_2$, $TiO_2$, MgF, and $SiN_x$, the mirror structure layer 120 may be easily formed through a PECVD (Plasma-Enhanced Chemical Vapor Deposition) scheme, a sputtering scheme, or an E-beam deposition scheme.

The thickness of each of the first and second mirror layers 171 and 122 may be obtained as multiply a weight constant W by a value obtained by dividing the wavelength (λ) of the light emitted from the light emitting structure 145 by 4 nm (n: refractive index, and m: natural number). In this case, the weight constant (W) may be in the range of about 1.05 to about 1.25, preferably, in the range of about 1.1 to about 1.2. In the case of a blue light, the wavelength (λ) may be in the range of about 440 nm to about 490 nm. In the case of a green light, the wavelength (λ) may be in the range of about 500 nm to about 565 nm. In the case of a red light, the wavelength (λ) may be in the range of about 625 nm to about 740 nm. In addition, the wavelength (λ) may have a visible ray wavelength band of about 440 nm or less.

Meanwhile, the first mirror layer 121 may have one selected from the group consisting of $SiO_2$, $TiO_2$, MgF, and $SiN_x$. The second mirror layer 122 may have another one material selected from the group consisting of $SiO_2$, $TiO_2$, MgF, and $SiN_x$, but the embodiment is not limited thereto. The material may be easily formed through the deposition scheme.

In addition, the difference between the first refractive index of the first mirror layer 121 and the second refractive index of the second mirror layer 122 may be 1 or more. Preferably, the first and second mirror layers 121 and 122 may be repeatedly stacked at least four times. Accordingly, the quantity of light reflected by the mirror structure layer 120 among lights incident at various incidence angles from the light emitting structure 145 may be increased.

Figure 7:
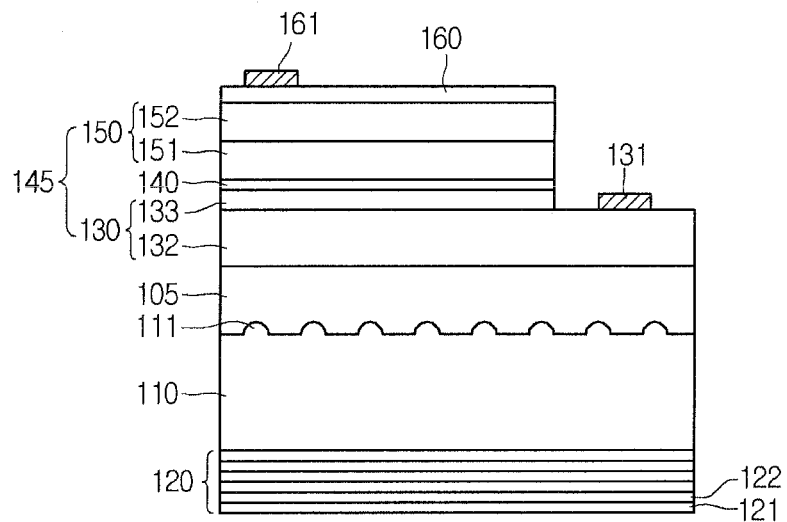
FIG. 7 is a side sectional view showing a light emitting device according to a second embodiment.

FIG. 7 is a side sectional view showing a light emitting device according to a second embodiment.

Referring to FIG. 7, the light emitting device includes the substrate 110, the mirror structure layer 120, the buffer layer 105, the first conductive semiconductor layer 130, the active layer 140, and the second conductive semiconductor layer 150.

The substrate 110 includes a light transmissive substrate material, and is disposed on a top surface thereof with a first light extraction structure 111. The first light extraction structure 111 may change the critical angle of an incident light. The first light extraction structure 111 has a protrusion shape. For example, the first light extraction structure 111 may have at least one of a stripe shape, a conical shape, a prism shape, and a hemi-spherical shape.

The buffer layer 105 is formed on the substrate 110, and has a lattice constant corresponding to an intermediate value between the lattice constants of the substrate 110 and a nitride semiconductor. In addition, the buffer layer 105 may include a semiconductor material having a compositional formula of $In_xAl_yGa_{1-x-y}N$ ($0 \leq x \leq 1$, $0 \leq y \leq 1$, and $0 \leq x+y \leq 1$). For example, the buffer layer 105 may include a material selected from the group consisting of InAlGaN, GaN, AlGaN, InGaN, AlN, InN, and AlInN, but the embodiment is not limited thereto. In addition, the buffer layer 105 may include a compound semiconductor including a group II to VI element, but the embodiment is not limited thereto. An undoped semiconductor layer may be additionally formed between the buffer layer 105 and the first conductive semiconductor layer 130, but the embodiment is not limited thereto.

The first conductive semiconductor layer 130 includes a first semiconductor layer 132 and a second semiconductor layer 133 on the first semiconductor layer 132. The second semiconductor layer 132 may have dopant concentration, a thickness, or a compound composition different from that of the third semiconductor layer 133. The dopant concentration of the first semiconductor layer 132 may be higher than that of the second semiconductor layer 133. For example, the first semiconductor layer 132 may have conductivity higher than that of the second semiconductor layer 133. In addition, the first semiconductor layer 132 may include an AlGaN layer, and the second semiconductor layer 133 may include a GaN layer. The first and second semiconductor layers 132 and 133 may be stacked at least two periods, but the embodiment is not limited thereto.

The stack structure of the first and second semiconductor layers 132 and 133 may have a superlattice structure (SLS), and may include a material selected from the group consisting of GaN, InN, AlN, InGaN, AlGaN, InAlGaN, $SiO_2$, $SiO_x$, $SiN_2$, $SiN_x$, $SiO_xN_y$, and a metallic material. The superlattice structure may have at least two stack structures in which at least two different layers are alternately repeated. For example, the supperlattice structure may include a stack structure of InGaN/GaN layers. Each layer of the supperlattice structure may have a thickness of at least a few Å.

In addition, the stack structure of the first and second semiconductor layers 132 and 133 may be formed by alternately stacking at least two layers having different refractive indexes and may serve as a reflection layer. For example, at least two stack structures of the GaN/AlN layers may serve as a DBR (Distributed Bragg Reflectors).

The second conductive semiconductor layer 150 includes a third semiconductor layer 151 and a fourth semiconductor layer 152 formed on the third semiconductor layer 151. The third semiconductor layer 151 may have a dopant concentration, a thickness, or a compound composition different from that of the fourth semiconductor layer 152. The dopant concentration of the third semiconductor layer 151 may be lower than that of the fourth semiconductor layer 152. For example, the fourth semiconductor layer 152 may have conductivity lower than the third semiconductor layer 151. In addition, the third semiconductor layer 151 includes an AlGaN layer, and the fourth semiconductor layer 152 includes a GaN layer. The third and fourth semiconductor layers 151 and 152 may have at least two stack structures, but the embodiment is not limited thereto The stack structure of the third and fourth semiconductor layers 151 and 152 may have a superlattice structure (SLS), and may include a material selected from the group consisting of GaN, InN, AlN, InGaN, AlGaN, InAlGaN, $SiO_2$, $SiO_x$, $SiN_2$, $SiN_x$, $SiO_xN_y$, and a metallic material. The superlattice structure may have at least two stack structures in which at least two different layers are alternately repeated. For example, the supperlattice structure may include InGaN/GaN layers. Each layer of the supperlattice structure may have a thickness of at least a few Å.

In addition, the stack structure of the third and fourth semiconductor layers 151 and 152 may be formed by alternately stacking at least two layers having different refractive indexes and may serve as a reflection layer. For example, at least two stack structures of the GaN/AlN layers serves as a DBR (Distributed Bragg Reflectors).

The light emitting device according to the embodiment includes the first light extraction structure 111 formed on the substrate 110 and the mirror structure layer 120 formed under the substrate 110, so that external quantum efficiency can be improved. In particular, the extraction efficiency of the light directed from the active layer 140 toward the substrate 110 can be increased.

Figure 8:
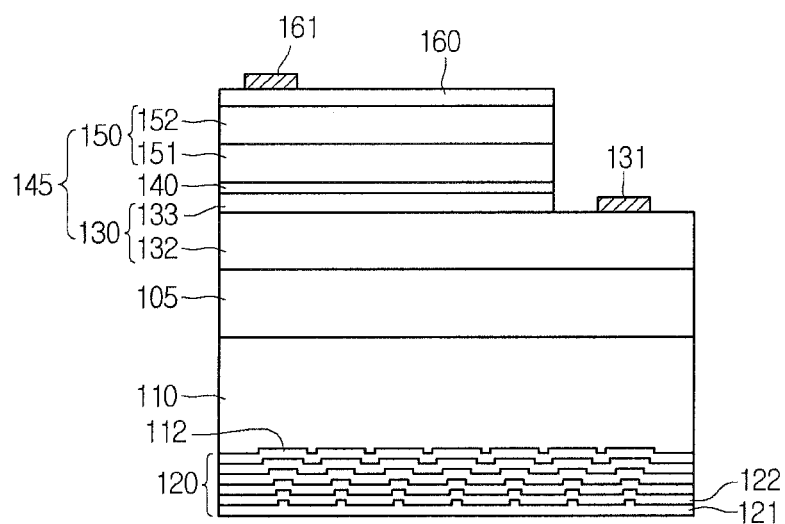
FIG. 8 is a side sectional view showing a light emitting device according to a third embodiment.

FIG. 8 is a side sectional view showing a light emitting device according to a third embodiment.

Referring to FIG. 8, the light emitting device includes the substrate 110, the mirror structure layer 120, the buffer layer 105, the first conductive semiconductor layer 130, the active layer 140, and the second conductive semiconductor layer 150.

A second light extraction structure 112 is formed on the bottom surface of the substrate 110. The second light extraction structure 112 is formed at a plurality of concavo-convex patterns on the bottom surface of the substrate 110. The concavo-convex pattern may include at least one of a stripe shape, a conical shape, a prism shape, and a hemi-spherical shape.

At least one of the layers 121 and 122 of the mirror structure layer 120 may include a concavo-convex layer by the second light extraction structure 112, and the concavo-convex layer can increase light reflection in the lateral direction of the light emitting device, and change the orientation angle. A width of each convex structure of the first mirror layer 121 differs from a size of convex structure of the second mirror layer 122. A lower surface of the mirror structure layer 120 is formed of a flat surface and a top surface of the mirror structure layer 120 is formed of an uneven surface.

Due to the second light extraction structure 112 formed on the lower surface of the substrate 110, the critical angle of the light incident into the lower surface of the substrate 110 can be changed, and the light incident into the mirror structure layer 120 can be reflected. Accordingly, external quantum efficiency can be improved at the lower portion of the substrate 110.

Figure 9:
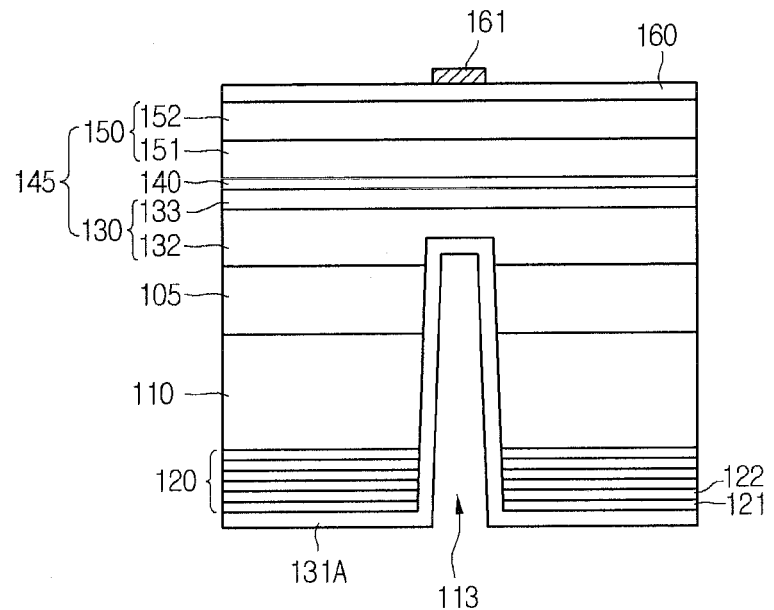
FIG. 9 is a side sectional view showing a light emitting device according to a fourth embodiment.

FIG. 9 is a side sectional view showing a light emitting device according to a fourth embodiment.

Referring to FIG. 9, the light emitting device includes the substrate 110, the mirror structure layer 120, the buffer layer 105, the first conductive semiconductor layer 130, the active layer 140, and the second conductive semiconductor layer 150. The second electrode 161 is disposed on a current spreading layer 160, and a first electrode layer 131A is disposed under the mirror structure layer 120.

The substrate 110 is disposed therein with a recess 113, and the recess 113 may be extended from the lower surface of the mirror structure layer 120 to a portion of the first conductive semiconductor layer 130. The recess 113 may expose the first semiconductor layer 132 of the first conductive semiconductor layer 130.

The first electrode layer 131A is disposed on the lower surface of the mirror structure layer 120, and a portion of the first electrode layer 131A is extended to a portion of the first conductive semiconductor layer 130 to make contact with the portion of the first conductive semiconductor layer 130.

The first electrode layer 131A may have a single layer structure or a multi-layer structure including at least a metallic material of Cu, Ag, Al, Ni, Ti, Cr, Pd, Au and Sn, but the embodiment is not limited thereto. The first electrode layer 131A is disposed on the lower surface of the substrate 110, thereby preventing the area of the active layer 140 from being reduced.

The first electrode layer 131A is disposed in opposition to the second electrode 161 with respect to the thickness direction of the light emitting structure 145. The first electrode layer 131A includes a reflective material, and covers at least 80% of the area of the lower surface of the mirror structure layer 120, so that the reflection efficiency can be more improved.

The first electrode layer 131A and the mirror structure layer 120 reflect the light traveling to the lower portion of the substrate 110, so that external quantum efficiency can be improved.

Figure 10:
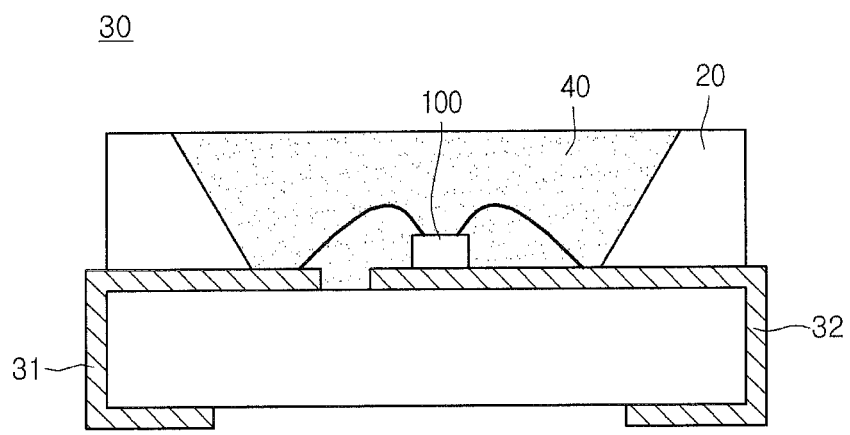
FIG. 10 is a sectional view showing a light emitting device package including the light emitting device according to the embodiment.

FIG. 10 is a sectional view showing a light emitting device package 30 including the light emitting device according to the embodiment.

Referring to FIG. 10, the light emitting device package 30 according to the embodiment includes a body 20, first and second lead electrodes 31 and 32 formed on the body 20, the light emitting device 100 disposed on the body 20 and electrically connected to the first and second lead electrodes 31 and 32 and a molding member 40 that surrounds the light emitting device 100.

The body 20 may include silicon, synthetic resin or metallic material. The body 20 may have inclined surfaces around the light the body 20 may have a cavity having an opened upper portion, and at least one light emitting device 100 may be disposed in the cavity.

The first and second lead electrodes 31 and 32 are electrically isolated from each other to supply power to the light emitting device 100. The first and second lead electrodes 31 and 32 reflect a light generated from the light emitting device 100 to increase the light efficiency and discharge heat emitted from the light emitting device 100.

The light emitting device 100 may be disposed on the body 20, or may be disposed on the first lead electrode 31 or the second lead electrode 32.

Although the light emitting device 100 is electrically connected to the first and second lead electrodes 31 and 32 by using a wire, the embodiment is not limited thereto. For example, the light emitting device 100 may be electrically connected to the first and second lead electrodes 31 and 32 through a flip chip scheme or a die bonding scheme.

A molding member 40 surrounds the light emitting device 100 to protect the light emitting device 100. In addition, the molding member 40 may include phosphors to change the wavelength of the light emitted from the light emitting device 100. At least one lens may be formed on the molding member 40 or the body 20. The lens may include a convex lens, a concave lens, or a concavo-convex lens.

A light emitting device according to the embodiment (embodiments) is packaged on a board or provided in the form of a light emitting device package to serve as a light source for an indicator, a lighting unit, or a display unit. The light emitting device or the light emitting device package according to the embodiment may be applied to a light unit as a light source. The light unit has a structure in which a plurality of light emitting device packages are arrayed, and is uses as a side view type light source or a top view type light source. The light source can supply a backlight light to the display panel. The light emitting device or the light emitting device package can be applied to a light source of a lighting unit, and the lighting unit may include an indicator, a signal lamp, and a headlight of a vehicle, an electric sign board.

Figure 11:
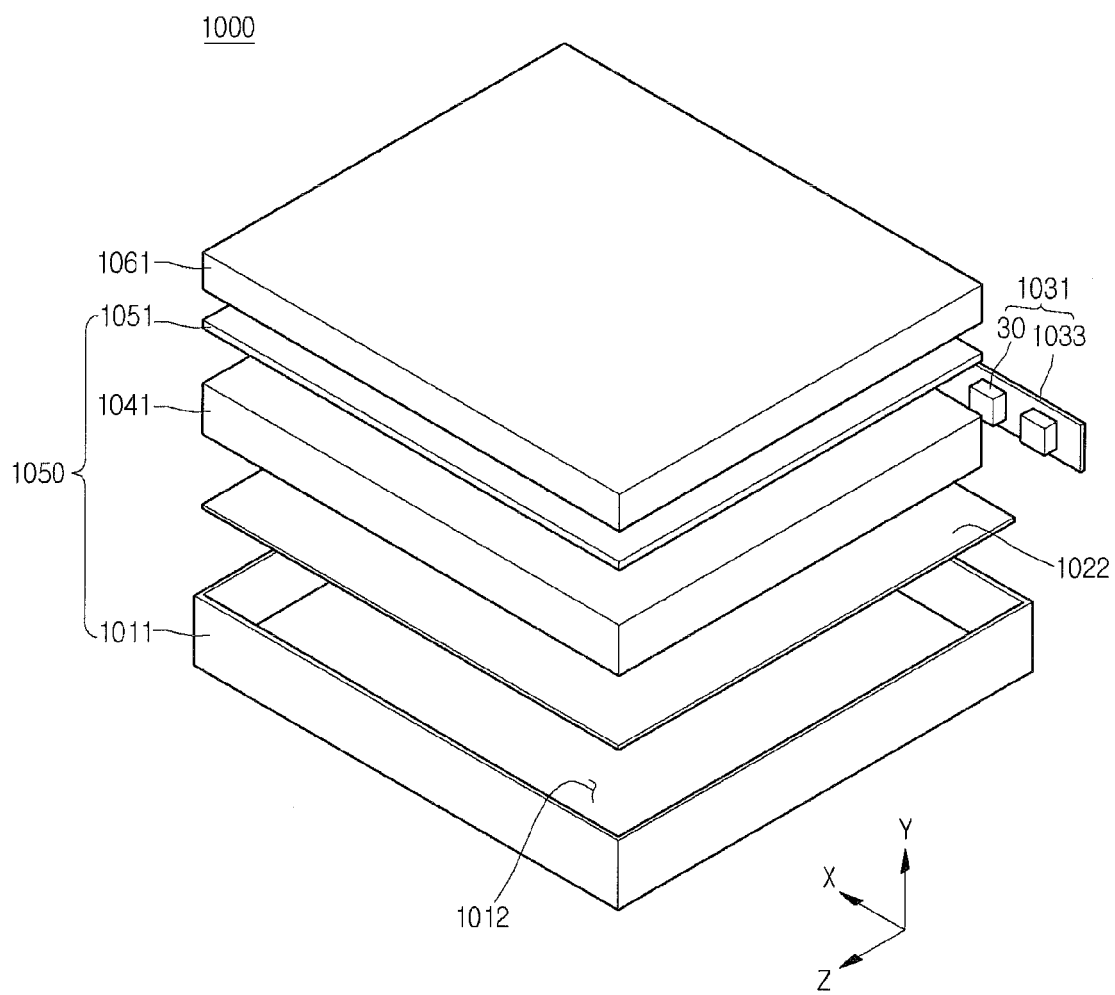
FIG. 11 is a view showing a display apparatus according to the embodiment.
Figure 12:
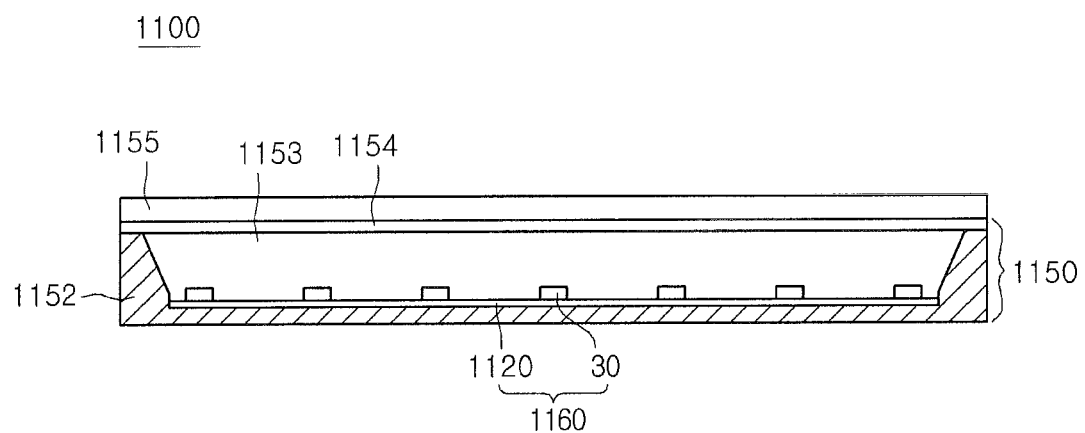
FIG. 12 is a view showing a display apparatus according to another embodiment.
Figure 13:
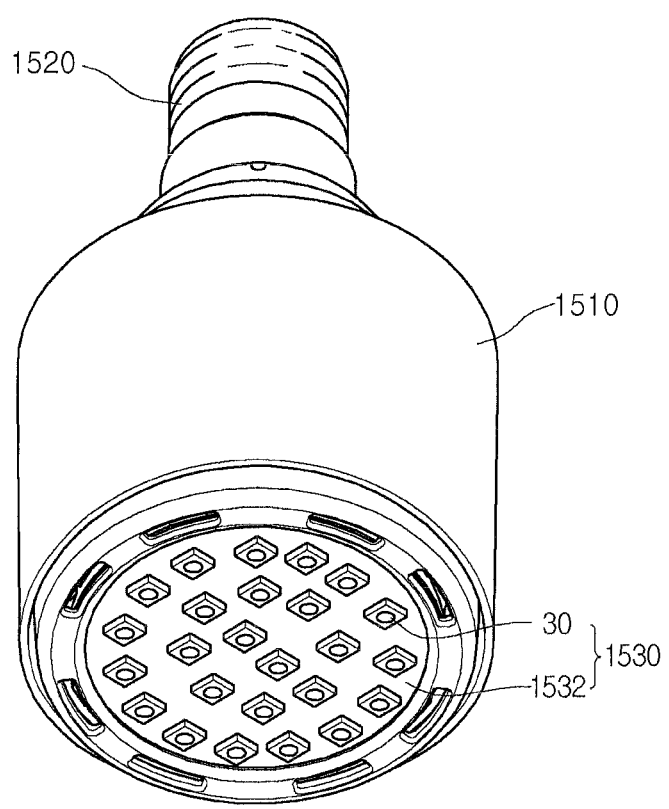
FIG. 13 is a view showing a lighting unit according to the embodiment.

The lighting system may include a display apparatus shown in FIGS. 11 and 12, a lighting device shown in FIG. 13, in addition to a lighting lamp, a signal light, a vehicle headlight, an electronic display, etc.

FIG. 11 is a disassembled perspective view of a display apparatus according to an embodiment.

Referring to FIG. 11, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel n4 the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1014, and the optical sheet 1051 as optical members positioned on a light path of the light emitting module 1031, but the present disclosure is not limited thereto.

FIG. 12 is a cross-sectional view of a display apparatus according to an embodiment.

Referring to FIG. 12, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

FIG. 13 is a perspective view of a lighting device according to an embodiment.

Referring to FIG. 13, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CR1).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, the light emitting device 100 may be prepared as a light emitting module in which the light emitting device 100 is packaged and then mounted on the substrate, or the light emitting device 100 is mounted in the form of an LED chip and packaged.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure that includes a first conductive semiconductor layer, an active layer on the first conductive semiconductor layer, and a second conductive semiconductor layer on the active layer;
   a light transmissive substrate disposed under the light emitting structure and having a refractive index that is less than a refractive index of the first conductive semiconductor layer;
   a mirror structure layer disposed under the light transmissive substrate and including a first mirror layer having a first refractive index and a second mirror layer having a second refractive index different from the first refractive index, wherein the first mirror layer and the second mirror layer are alternately stacked on each other; and
   a first electrode layer under the mirror structure layer,
   wherein the first mirror layer has a thickness of $W\cdot\lambda/(4\cdot n1\cdot m)$, and the second mirror layer has a thickness of $W\cdot\lambda/(4\cdot n2\cdot m)$ in which $\lambda$ represents a wavelength of a light emitted from the light emitting structure, n1 represents the first refractive index, n2 represents the second refractive index, m represents a natural number, and W represents a weight constant in a range of about 1.05 to about 1.25.

2. The light emitting device of claim 1, wherein the first mirror layer includes one selected from the group consisting of $SiO_2$, $TiO_2$, MgF, and $SiN_x$ and the second mirror layer includes another one selected from the group consisting of $SiO_2$, $TiO_2$, MgF, and $SiN_x$.

3. The light emitting device of claim 1, wherein the weight constant has a value in a range of about 1.1 to about 1.2.

4. The light emitting device of claim 1, wherein the mirror structure layer includes a pair of the first and second mirror layers repeatedly stacked on each other at least four times.

5. The light emitting device of claim 1, wherein the substrate includes one selected from the group consisting of sapphire ($Al_2O_3$), GaN, ZnO, and AlN.

6. The light emitting device of claim 1, wherein at least one layer of the light emitting structure includes a compound semiconductor material having a compositional formula of $In_xAl_yGa_{1-x-y}N$ ($0 \leq x \leq 1$, $0 \leq y \leq 1$ and $0 \leq x+y \leq 1$).

7. The light emitting device of claim 1, further comprising:
   a current spreading layer on the second conductive semiconductor layer; and
   a second electrode on the current spreading layer,
   wherein a portion of the first electrode layer is connected to the first conductive semiconductor layer.

8. The light emitting device of claim 1, further comprising at least one of a first light extraction structure on a top surface of the substrate and a second light extraction structure on a lower surface of the substrate.

9. The light emitting device of claim 1, wherein a difference between the first and second refractive indexes in the mirror structure layer is 1 or more.

10. A light emitting device comprising:
    a light emitting structure that includes a first conductive semiconductor layer, an active layer on the first conductive semiconductor layer, and a second conductive semiconductor layer on the active layer;
    a substrate disposed under the light emitting structure and having a refractive index that is less than a refractive index of the first conductive semiconductor layer;
    a mirror structure layer disposed under the substrate and including a plurality of first mirror layers having a first refractive index that is greater than a refractive index of the substrate, and a plurality of second mirror layers disposed between the first mirror layers and having a second refractive index that is less than the first refractive index;

a first electrode layer under the mirror structure layer; and a second electrode on the light emitting structure, wherein the first mirror layer has a thickness of $W \cdot \lambda/(4 \cdot n1 \cdot m)$, and the second mirror layer has a thickness of $W \cdot \lambda/(4 \cdot n2 \cdot m)$ in which $\lambda$ represents a wavelength of a light emitted from the light emitting structure, n1 represents the first refractive index, n2 represents the second refractive index, m represents a natural number, and W represents a weight constant in a range of about 1.05 to about 1.25.

11. The light emitting device of claim 10, wherein a lower surface of the mirror structure layer is formed of a flat surface, and a top surface of the mirror structure layer is formed of an uneven surface.

12. The light emitting device of claim 10, wherein a pair of the first and second mirror layers include at least one of a $TiO_2/SiO_2$ stack structure, a $TiO_2/MgF$ stack structure, and a $TiO_2/SiOx$ stack structure.

13. The light emitting device of claim 10, wherein the second mirror layers include at least four layers, and one of the four layers contact a lower surface of the substrate.

14. The light emitting device of claim 11, wherein the substrate is disposed on a lower surface thereof with a concavo-convex light extraction structure, and at least one layer of the mirror structure layer includes a concavo-convex layer.

15. The light emitting device of claim 10, wherein a portion of the first electrode layer contacts an inner part of the first conductive semiconductor layer.

16. The light emitting device of claim 10, wherein the first electrode layer covers at least 80% of an area of a lower surface of the mirror structure layer.

17. The light emitting device of claim 10, wherein a difference in thicknesses between the first mirror layer and the second mirror layer is in a range of about 50 nm to about 70 nm.

18. The light emitting device of claim 17, wherein a difference between the first and second refractive indexes of the mirror structure layer is 1 or more.

19. A light emitting device package comprising:

a body;

a plurality of lead electrodes on the body;

a light emitting device electrically connected to the lead electrodes; and a molding member covering the light emitting device, wherein the light emitting device comprises:

a light emitting structure that includes a first conductive semiconductor layer, an active layer on the first conductive semiconductor layer, and a second conductive semiconductor layer on the active layer;

a light transmissive substrate disposed under the light emitting structure and having a refractive index that is less than a refractive index of a compound semiconductor layer; and a mirror structure layer disposed under the light transmissive substrate and including a first mirror layer having a first refractive index and a second mirror layer having a second refractive index different from the first refractive index, wherein the first mirror layer and the second mirror layer are alternately stacked on each other;

a first electrode layer under the mirror structure layer; and a second electrode on the light emitting structure, wherein the first mirror layer has a thickness of $W \cdot \lambda/(4 \cdot n1 \cdot m)$, and the second mirror layer has a thickness of $W \cdot \lambda/(4 \cdot n2 \cdot m)$ in which $\lambda$ represents a wavelength of a light emitted from the light emitting structure, n1 represents the first refractive index, n2 represents the second refractive index, m represents a natural number, and W represents a weight constant in a range of about 1.05 to about 1.25.

20. The light emitting device of claim 7, wherein the first electrode layer covers at least 80% of an area of a lower surface of the mirror structure layer.

* * * * *